United States Patent
He et al.

(10) Patent No.: US 9,890,449 B2
(45) Date of Patent: Feb. 13, 2018

(54) METHODS OF FORMING MGO BARRIER LAYER

(71) Applicant: Seagate Technology LLC, Cupertino, CA (US)

(72) Inventors: Qing He, Plymouth, MN (US); Jae Young Yi, Prior Lake, MN (US); Eric W. Singleton, Maple Plain, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 238 days.

(21) Appl. No.: 14/699,190

(22) Filed: Apr. 29, 2015

(65) Prior Publication Data
US 2016/0319419 A1  Nov. 3, 2016

(51) Int. Cl.
| | | |
|---|---|---|
| C23C 14/00 | (2006.01) |
| C23C 14/08 | (2006.01) |
| G11B 5/39 | (2006.01) |
| C23C 28/00 | (2006.01) |
| C23C 14/56 | (2006.01) |
| C23C 14/58 | (2006.01) |
| G11B 5/31 | (2006.01) |
| B82Y 25/00 | (2011.01) |

(52) U.S. Cl.
CPC .......... C23C 14/081 (2013.01); C23C 14/568 (2013.01); C23C 14/5806 (2013.01); C23C 28/32 (2013.01); C23C 28/322 (2013.01); C23C 28/345 (2013.01); G11B 5/3909 (2013.01); *B82Y 25/00* (2013.01); *G11B 5/3163* (2013.01)

(58) Field of Classification Search
CPC .............................. C23C 14/081; B82Y 25/00
See application file for complete search history.

(56) References Cited

U.S. PATENT DOCUMENTS

| | | | |
|---|---|---|---|
| 6,841,395 B2 | 1/2005 | Linn et al. | |
| 6,914,257 B2 | 7/2005 | Shimura et al. | |
| 7,488,609 B1 | 2/2009 | Lin et al. | |
| 7,780,820 B2 | 8/2010 | Zhao et al. | |
| 8,337,676 B2 | 12/2012 | Zhao et al. | |
| 8,557,407 B2 | 10/2013 | Zhao et al. | |
| 2007/0148786 A1* | 6/2007 | Horng | B82Y 25/00 438/2 |
| 2008/0151615 A1* | 6/2008 | Rodmacq | B82Y 25/00 365/173 |
| 2008/0253039 A1 | 10/2008 | Nagamine et al. | |
| 2011/0254114 A1 | 10/2011 | Nagamine et al. | |
| 2013/0134032 A1 | 5/2013 | Tsunekawa et al. | |
| 2013/0234266 A1* | 9/2013 | Prejbeanu | G01R 33/098 257/421 |

FOREIGN PATENT DOCUMENTS

KR   10-2005-0010713 A    1/2005

* cited by examiner

*Primary Examiner* — Timon Wanga
(74) *Attorney, Agent, or Firm* — Holzer Patel Drennan

(57) ABSTRACT

A method of making an MgO barrier layer for a TMR sensor, the method including depositing a first Mg layer in a first chamber, depositing a second Mg layer on the first Mg layer using a reactive oxide deposition process in the presence of oxygen in the first chamber or in a second chamber different than the first chamber, depositing a third Mg layer on the second MgO layer in either the first chamber, the second chamber, or a third chamber, and annealing the first layer, the second layer, and the third layer to form an MgO barrier layer.

17 Claims, 10 Drawing Sheets

METHODS OF FORMING MGO BARRIER LAYER

BACKGROUND

Tunneling magnetoresistive (TMR) sensors with a magnesium oxide (MgO) barrier layer have been used as readers in many commercial disc drive products due to the simple and robust barrier layer that also provides a high TMR value and low area resistance (RA).

As the desired for increased drive capacity grows, there is a need to increase TMR of the reader sensor, while maintaining a low RA; this however has been a big challenge.

SUMMARY

One particular implementation described herein is a method of making an MgO barrier layer for a TMR sensor, the method including depositing a first MgO-source layer from an Mg target, depositing a second MgO-source layer on the first layer using a reactive oxide deposition process in the presence of oxygen from an Mg target, depositing a third MgO-source layer on the second layer from an Mg target, and annealing the first MgO-source layer, the second MgO-source layer, and the third MgO-source layer to form an MgO barrier layer.

Another particular implementation is a method of making an MgO barrier layer for a TMR sensor, the method including depositing a first Mg layer in a first chamber, depositing a second Mg layer on the first Mg layer using a reactive oxide deposition process in the presence of oxygen in the first chamber or in a second chamber different from the first chamber, depositing a third Mg layer on the second MgO layer in either the first chamber, the second chamber, or a third chamber different than both of the first chamber and the second chamber, and annealing the first layer, the second layer, and the third layer to form an MgO barrier layer.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following detailed description.

BRIEF DESCRIPTIONS OF THE DRAWING

The described technology is best understood from the following Detailed Description describing various implementations read in connection with the accompanying drawings.

DETAILED DESCRIPTION

As indicated above, it has been a challenge to increase TMR of a reader sensor while maintaining a low RA (e.g., <0.7 ohm-micrometer$^2$), particularly when an MgO barrier layer is present.

When a radio frequency (RF) deposition process is used to form the MgO barrier layer, the plasma ion damages the RF-MgO barrier layer, which leads to poor barrier textural structure and pinholes in the barrier, all which leads to TMR reduction and increased (undesired) exchange coupling with the free layer at low RA. One way to obtain increased area density is to improve the quality of the MgO barrier layer. The present disclosure provides a solution to the ion damage problem, by using an alternative process to form the MgO barrier layer.

Instead of using RF-deposition process and an MgO oxide target for the barrier deposition, the present disclosure describes using a reactive oxidation (R-ox) MgO deposition process to form at least a part of the MgO barrier layer; this is done by depositing Mg metal film in the presence of oxygen, such as oxygen gas. Such an R-ox MgO process, which operates at low power deposition (e.g., less than 600 W, or less than 200 W) of the Mg metal film, produces little or no ion damage on the deposited film, and has the potential to reduce the free layer exchange coupling of the MgO barrier layer, especially at low RA, and to increase the TMR of the sensor. Additionally, the MgO barrier layer formed by the R-ox deposition process is more uniform and smooth, with less pinholes than an RF-MgO barrier layer.

In the following description, reference is made to the accompanying drawing that forms a part hereof and in which are shown by way of illustration at least one specific implementation. The following description provides additional specific implementations. It is to be understood that other implementations are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

Figure 1:
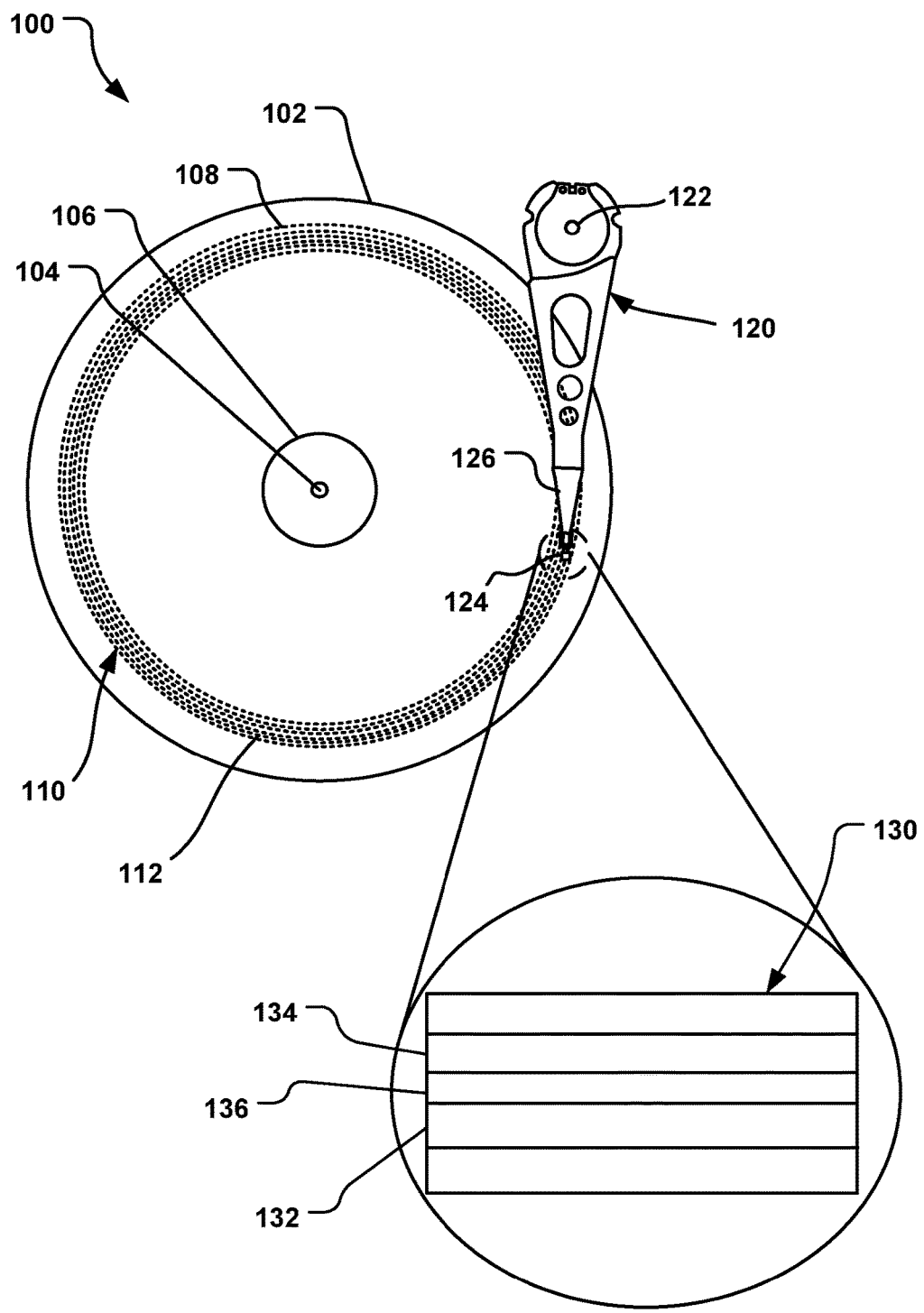
FIG. 1 is a top plan view of an example data storage system.

FIG. 1 illustrates a perspective view of an exemplary data storage system 100, particularly, a disc drive 100. The disc drive 100 includes a base and a top cover that combine to form a housing 101 in which is located one or more rotatable magnetic data storage media or discs 102. The disc 102 rotates about a spindle center or a disc axis of rotation 104 during operation. The disc 102 includes an inner diameter 106 and an outer diameter 108 between which are a number of concentric data tracks 110, illustrated by circular dashed lines. The data tracks 110 are substantially circular and are made up of regularly spaced bits 112, indicated as dots or ovals on the disc 102. It should be understood, however, that the described technology may be employed with other types of storage media, including continuous magnetic media, discrete track (DT) media, etc.

Information may be written to and read from the bits 112 on the disc 102 in different data tracks 110. A head-gimbal assembly (HGA) 120 having an actuator axis of rotation 122 supports a slider 124 on an arm 126 in close proximity above the surface of the disc 102 during disc operation. When a pack of multiple discs 102 is utilized, each disc 102 or medium surface has an associated slider 124 which is mounted adjacent to and in communication with its corresponding disc 102.

The surface of the slider 124 closest to and opposite to the disc 102 is called the air-bearing surface (ABS). In use, the head-gimbal assembly 120 rotates during a seek operation about the actuator axis of rotation 122 to position the slider 124 and the head-gimbal assembly 120 over a target data track of the data tracks 110. As the disc 102 spins, a layer of air forms between slider 124 and the surface of the disc 102, resulting in the slider 124 'flying' above the disc 102. A transducer on the slider 124 then reads or writes data to the bits 112 in the target data track 110.

The inset of FIG. 1 illustrates portions of an exemplary implementation of a transducer 130, in particular, a tunneling magnetoresistive (TMR) sensor, viewed from the ABS. The transducer 130, or sensor 130, is formed by multiple ferromagnetic layers including a pinned, reference layer 132 and a free layer 134, and a non-magnetic dielectric MgO (magnesium oxide) barrier layer 136 therebetween. The MgO barrier layer 136 was formed, in part, utilizing a reactive oxidation deposition process.

Figure 2:
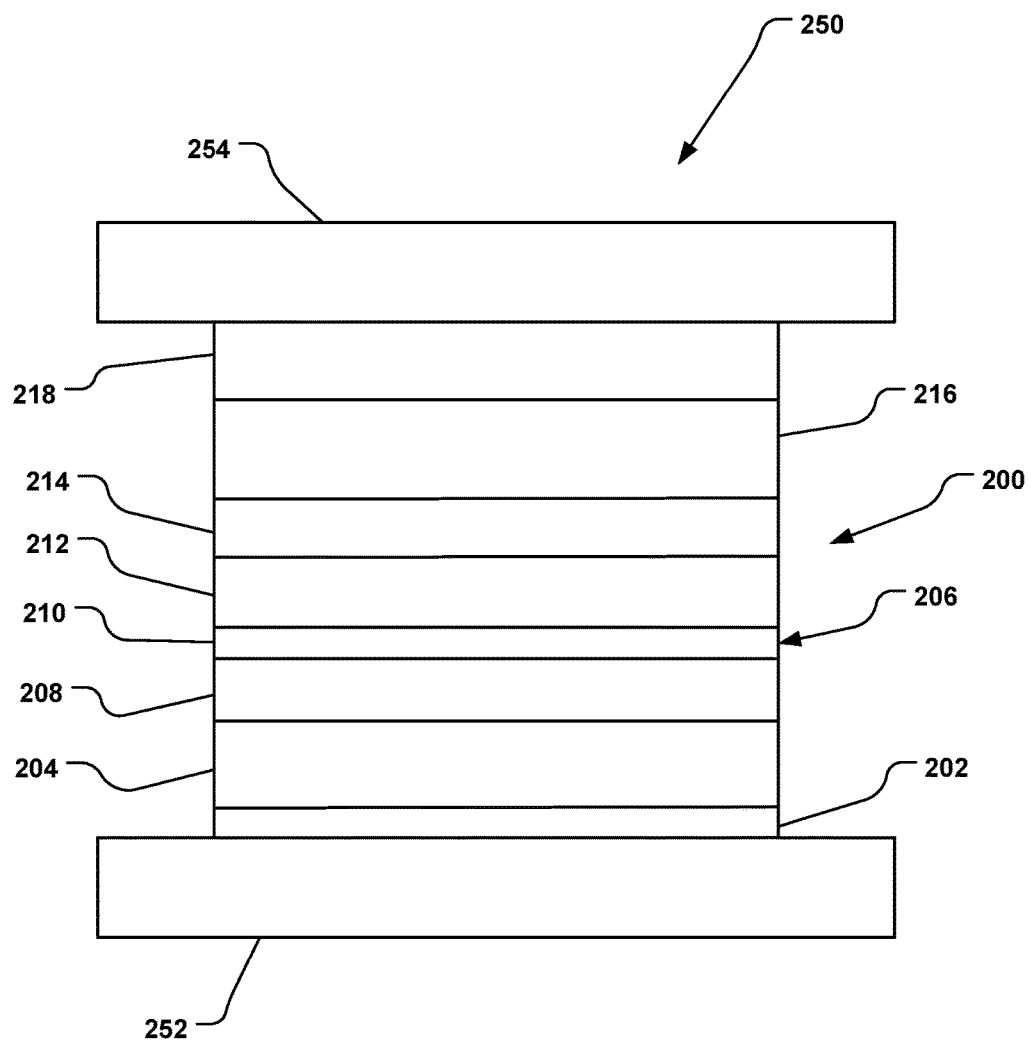
FIG. 2 is a schematic side view of an example of a tunneling magnetoresistive (TMR) sensor.

Turning to FIG. 2, a TMR sensor 200 is shown as a stack of layers that has ferromagnetic layers separated by a thin non-magnetic dielectric layer.

A bottom (seed) layer 202 in the TMR sensor 200 is generally formed from one or more seed layers that promote a smooth and dense crystal growth in overlying layers. Above and optionally adjacent to the seed layer 202 is an anti-ferromagnetic (AFM) pinning layer 204 and a synthetic antiferromagnetic (SAF) structure 206, which is composed of a ferromagnetic pinned layer 208, a non-magnetic spacer layer (e.g., Ru spacer layer) 210 and a reference layer 212, is on the AFM layer 204. A tunnel barrier layer 214, particularly an MgO barrier layer, is positioned above the SAF structure 206, particularly, above the reference layer 212. A ferromagnetic "free" layer 216 is formed on the MgO barrier layer 214. At the top of the TMR sensor 200 is a cap layer 218.

The SAF structure 206 is fixed by exchange coupling with the adjacent AFM layer 204. The free layer 216 has a magnetic moment that is either parallel or anti-parallel to the magnetic moment in the reference layer 212, and which switches in response to external magnetic fields. The MgO barrier layer 214 is sufficiently thin that a current can pass through it by quantum mechanical tunneling of conduction electrons. It is the relative orientation of the magnetic moments between the free layer 216 and the reference layer 212 that determines the tunneling current through the barrier layer 214 and therefore the resistance of the sensor 200.

In a magnetic read head 250, the TMR sensor 200 is formed between a bottom shield 252 and a top shield 254. Various conductors and/or electrodes are present in the read head 250 to connect the TMR sensor 200.

When a current is passed from the top shield 254 to the bottom shield 252 in a direction perpendicular to the planes of the TMR layers (CPP designation), a lower resistance is detected when the magnetization directions of the free layer 216 and the reference layer 212 are in a parallel state and a higher resistance is noted when they are in an anti-parallel state.

The advantages of a TMR sensor over giant magnetoresistive (GMR) sensor include a higher MR ratio and the preference for CPP geometry for high recording density. A high performance TMR sensor in a reader should have a low RA (area×resistance) value, high MR ratio, a soft free layer with low magnetostriction, a strong SAF structure, and low exchange coupling between the free layer and the reference layer through the barrier layer. The MR ratio is dR/R, where R is the minimum resistance of the TMR sensor and dR is the change in resistance observed by changing the magnetic state of the free layer. A higher MR ratio (i.e., dR/R) improves the readout speed of the TMR sensor. For high recording density or high frequency applications, it is desired to reduce RA to less than 0.7 ohm-micrometer$^2$. As a consequence of low RA, MR ratio drops significantly. To maintain a reasonable signal-to-noise (SNR) ratio, a higher MR ratio is desirable.

Figure 3:
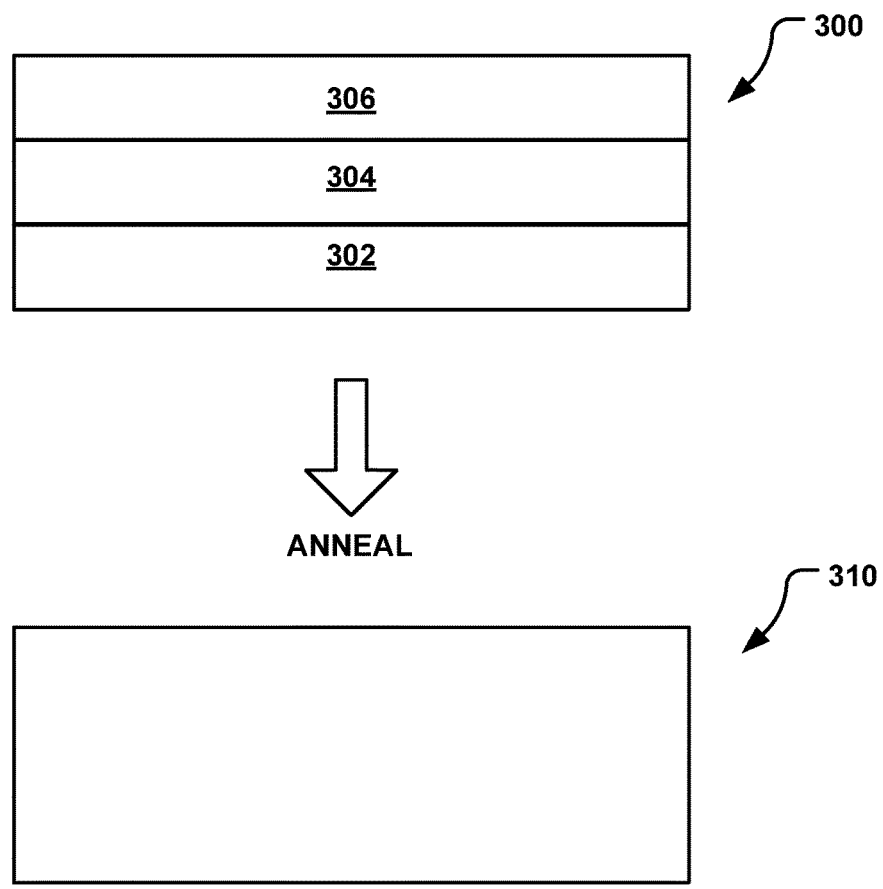
FIG. 3 is a schematic side view of examples of a tunneling barrier layer.

In this implementation, the MgO tunnel barrier layer 214 is formed from three MgO-source layers that, after being formed individually one on top of the other, are transformed into the MgO barrier layer 214 after the sensor 200 undergoes a post thermal anneal. FIG. 3 illustrates an enlarged view of an MgO tunnel barrier pre-layer 300 prior to annealing. The pre-layer 300 has a first layer 302, a second or middle layer 304, and a third layer 306; the second layer 304 is interior to the first layer 302 and the third layer 306. Each of the three layers 302, 304, 306 has a thickness in the range of about 0.1 Angstrom to 20 Angstrom, and the thicknesses may be the same or differ among the layers 302, 304, 306.

The first layer 302 is formed by depositing an Mg metal layer, for example, by a DC-sputter deposition process, from a metal Mg target. The second layer 304 is formed by reactively depositing, onto the first layer 302, Mg metal, from a metal Mg target, with a small amount of oxygen ($O_2$). Because of the presence of oxygen during the R-ox deposition, the Mg metal is doped with a small amount of oxygen. The deposition power for the R-ox deposition is, for example, in the range of about 10 W and 600 W. The third layer 306 is formed by depositing an Mg metal layer, for example, by a DC-sputter deposition, from a metal Mg target.

The deposition temperature for any or all of the layers 302, 304, 306 is less than about 400° C. The deposition rate, for either the R-ox deposition or the DC-deposition, is about 0.01 to 10 Angstrom/s.

After the three layers 302, 304, 306 are formed, the pre-layer 300 undergoes a thermal anneal process, typically after the entire reader stack is formed, which converts the three layers 302, 304, 306 to MgO and fuses all the layers 302, 304, 306 together, resulting in an MgO barrier layer 310 with a homogenous crystalline structure throughout the layer. In some implementations, after the anneal, no interface can be found between the layers (e.g., between layer 302 and layer 304, or between layer 304 and layer 306).

Additionally, in some implementations, the chemical structure is homogeneous throughout the resulting MgO layer 310.

An exemplary process equipment assembly for depositing the three MgO source layers has a plurality of chambers and targets and can be configured to form all layers of a TMR sensor and, in some implementations, all layers of a magnetic read head. The deposition assembly has multiple high vacuum physical vapor deposition (PVD) chambers, each of which is configured to accept a wafer therein. The chambers may be configured for DC-sputtering, RF-sputtering, or evaporation deposition. Operably connected to each chamber is at least one target, the source of the material being deposited. Ions generated from a sputtering gas impinge on the target, creating an ionized material beam, which is then deposited on the wafer surface. Examples of suitable sputtering gases include argon (Ar), krypton (Kr), xenon (Xe), helium (He) and neon (Ne). In some implementations, multiple targets are used.

In one particular implementation, a first Mg layer is formed in a first chamber using a DC-sputter deposition process, a second MgO layer is formed in a second chamber using R-ox deposition with an oxygen source, and a third Mg layer is formed in a third chamber using DC-sputter deposition. Such a process can be referred to as a 'triple Mg process,' because three Mg layers are formed.

Prior to forming the Mg/MgO layers, other layers of the sensor stack, such as an AFM layer and a ferromagnetic pinned layer, can be formed on a substrate in the deposition assembly, in any one or more of the chambers. Additionally or alternately, after forming the Mg/MgO layers, other layers of the sensor stack, such as a ferromagnetic free layer, can be subsequently formed on the Mg/MgO layers.

Figure 4:
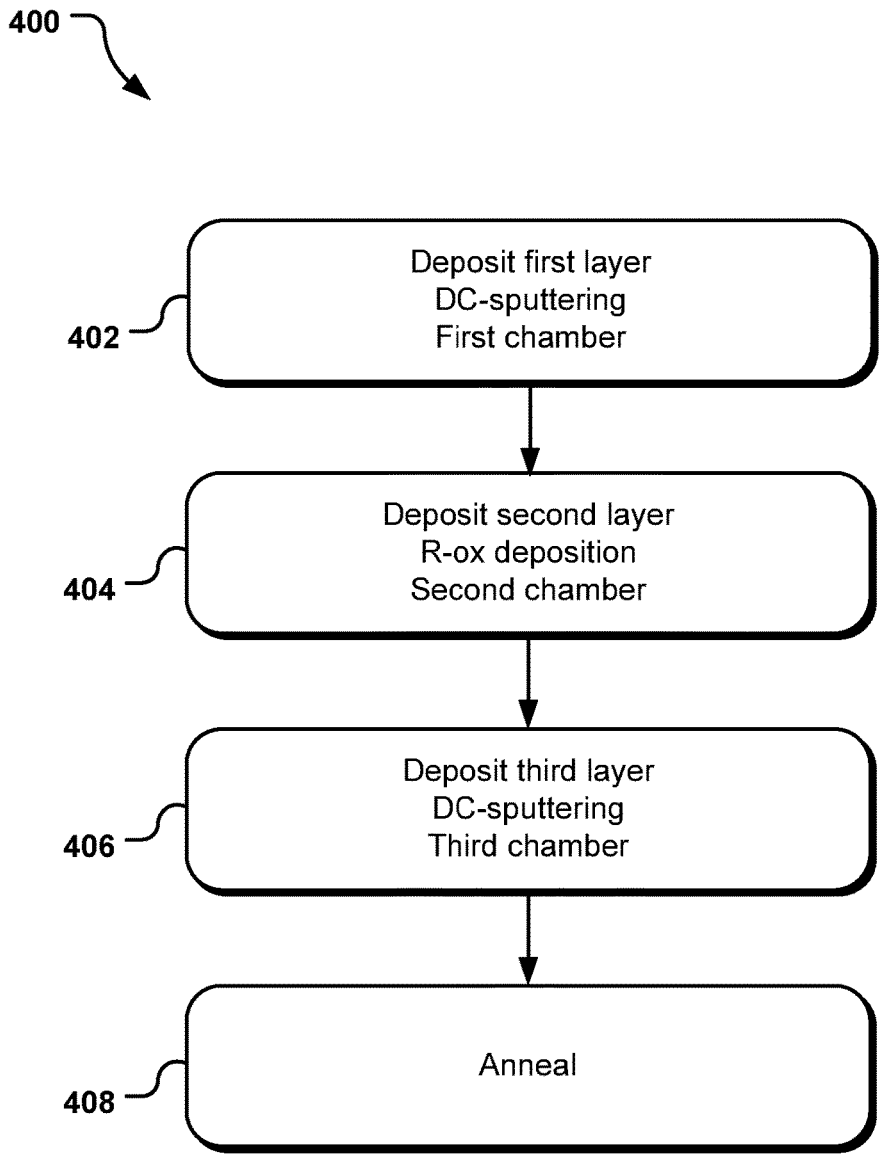
FIG. 4 is a step-wise flow diagram of an example method of forming an MgO barrier layer.

FIG. 4 provides an exemplary method 400 for forming an MgO barrier layer according to the present disclosure. In operation 402, a first layer is deposited onto a ferromagnetic reference layer (RL) via DC-sputter deposition in a first chamber with an Mg target. In operation 404, a second layer is deposited onto the first layer via reactive oxidation (R-ox) deposition in a second chamber. The target for the R-ox deposition is an Mg metal target. Oxygen ions are provided (e.g., injected) into the second chamber during the R-ox deposition. The oxygen may be provided as $O_2$, such as from a compressed oxygen source or a compressed air source, or may be provided by a source that dissociates to form $O^{-2}$ upon being exposed to the ionization source in the chamber; examples of oxygen ion sources include $H_2O$ and $H_2O_2$. In operation 406, a third layer is deposited onto the second layer via DC-sputter deposition in a third chamber with an Mg target. In operation 408, the first layer, second layer, and third layer undergo an annealing process, for example, for a time of 30 minutes to 8 hours, at temperatures from about 150° C. to 400° C.

Figure 5:
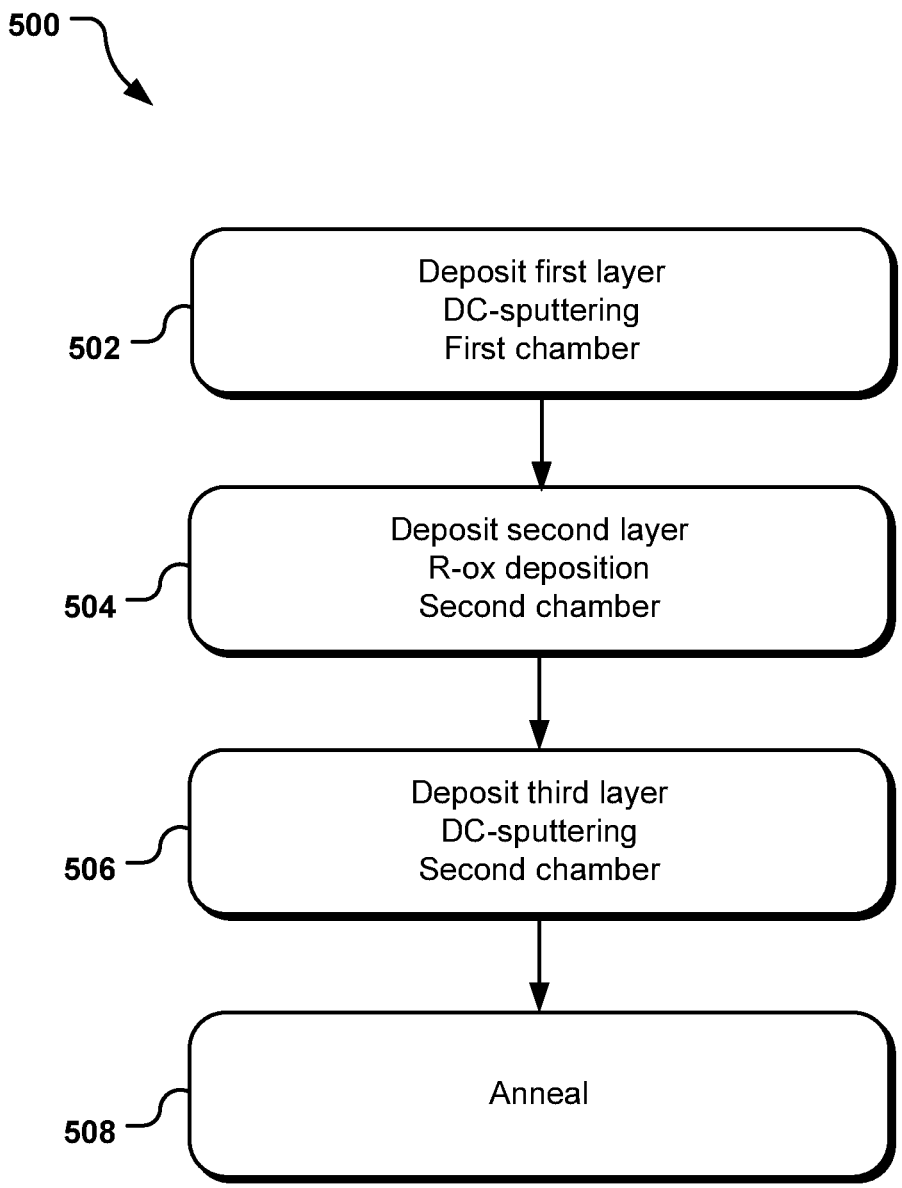
FIG. 5 is a step-wise flow diagram of another example method of forming an MgO barrier layer.

FIG. 5 provides an exemplary method 500 for forming an MgO barrier layer according to the present disclosure. Unless indicated otherwise, certain steps and/or details of the method 500 are the same as or similar to that of method 400. In operation 502, a first layer is deposited onto a ferromagnetic reference layer (RL) via DC-sputter deposition in a first chamber with an Mg target. In operation 504, a second layer is deposited onto the first layer via reactive oxidation (R-ox) deposition in a second chamber. The target for the R-ox deposition is an Mg metal target. Oxygen, either as $O_2$ or $O^{-2}$, is provided (e.g., injected) into the second chamber during the R-ox deposition. In operation 506, a third layer is deposited onto the second layer via DC-sputter deposition in the second chamber with an Mg target; this Mg target may be the same or different target than used for the second layer. In operation 508, the first layer, second layer, and third layer undergo an annealing process.

Figure 6:
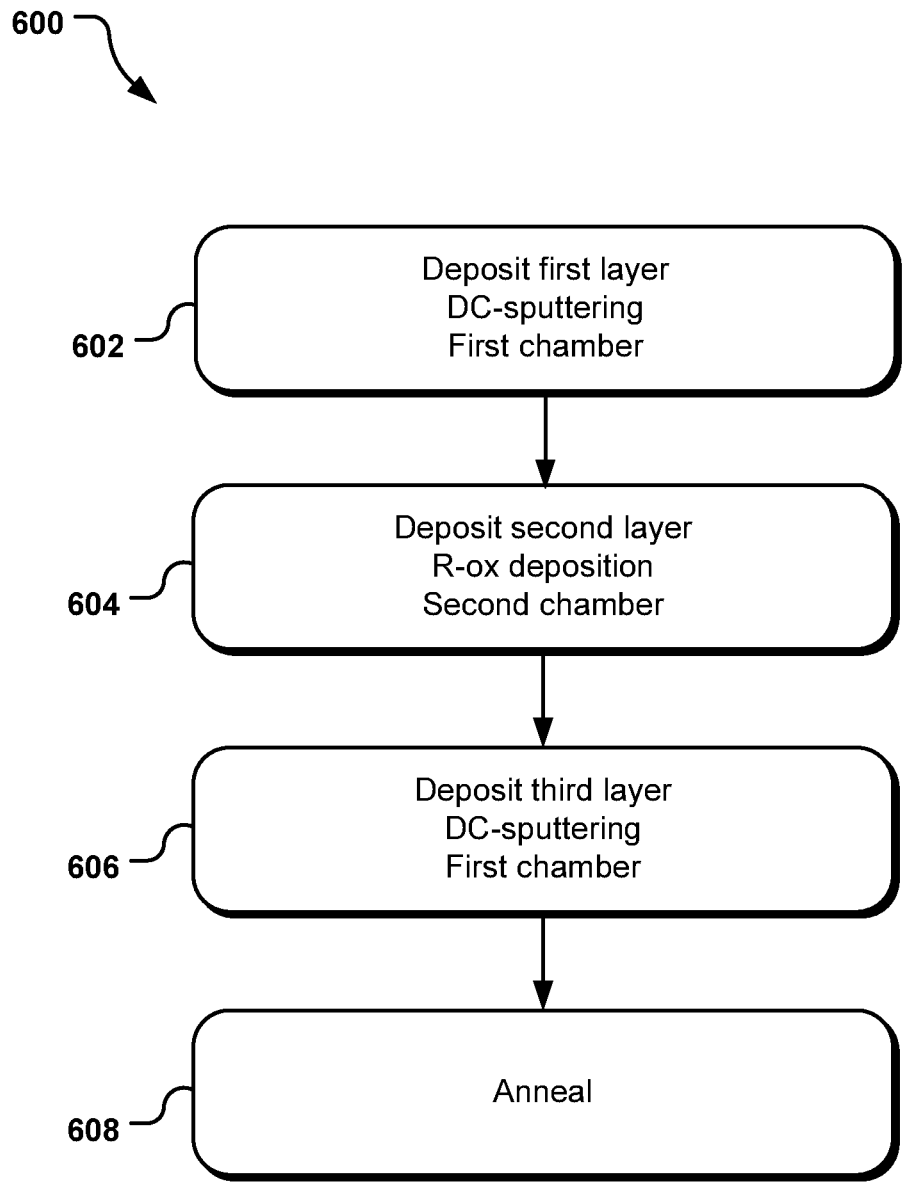
FIG. 6 is a step-wise flow diagram of another example method of forming an MgO barrier layer.

FIG. 6 provides an exemplary method 600 for forming an MgO barrier layer according to the present disclosure. Unless indicated otherwise, certain steps and/or details of the method 600 are the same as or similar to that of method 400 and/or method 500. In operation 602, a first layer is deposited onto a ferromagnetic reference layer (RL) via an RF-sputter deposition in a first chamber with an Mg target. In operation 604, a second layer is deposited onto the first layer via reactive oxidation (R-ox) deposition in a second chamber. The target for the R-ox deposition is an Mg metal target. Oxygen, either as $O_2$ or $O^{-2}$, is provided (e.g., injected) into the second chamber during the R-ox deposition. In operation 606, a third layer is deposited onto the second layer via DC-sputter deposition in the first chamber with the Mg target; this Mg target may be the same or different target than used for the first layer. In operation 608, the first layer, second layer, and third layer undergo an annealing process.

Figure 7:
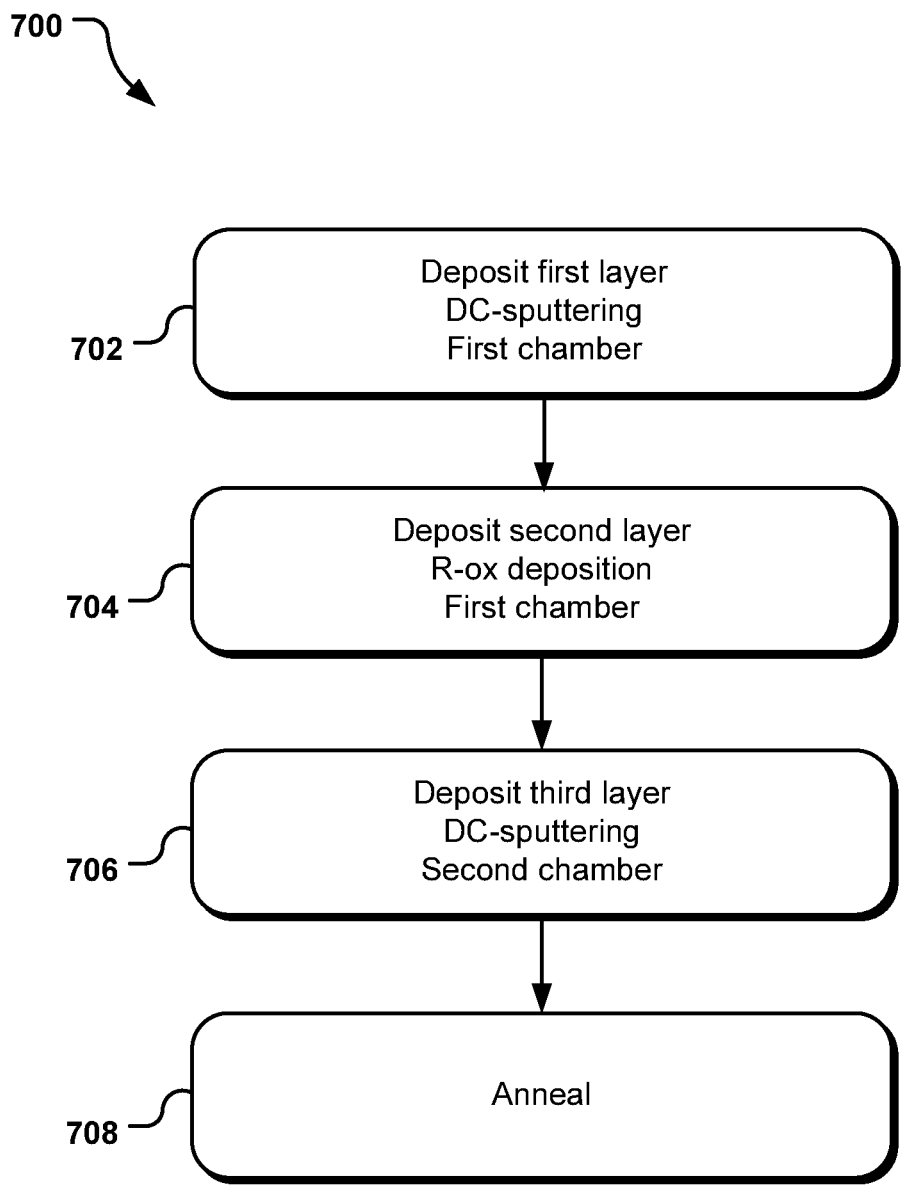
FIG. 7 is a step-wise flow diagram of another example method of forming an MgO barrier layer.

FIG. 7 provides an exemplary method 700 for forming an MgO barrier layer according to the present disclosure. Unless indicated otherwise, certain steps and/or details of the method 700 are the same as or similar to that of method 400, method 500 and/or method 600. In operation 702, a first layer is deposited onto a ferromagnetic reference layer (RL) via DC-sputter deposition in a first chamber with an Mg target. In operation 704, a second layer is deposited onto the first layer via reactive oxidation (R-ox) deposition in the first chamber. The target for the R-ox deposition is an Mg metal target; this Mg target may be the same or different target than used for the first layer. Oxygen, either as $O_2$ or $O^{-2}$, is provided (e.g., injected) into the chamber during the R-ox deposition. In operation 706, a third layer is deposited onto the second layer via DC-sputter deposition in the second chamber with the Mg target; this Mg target may be the same or different target than used for the second layer. In operation 708, the first layer, second layer, and third layer undergo an annealing process.

In each of methods 400, 600 and 700, the third layer is deposited in a chamber different than the chamber in which the oxygen was added (i.e., for the deposition of the second layer). Utilizing a different chamber for the third layer than the second layer reduces contamination of the third layer.

Figure 8:
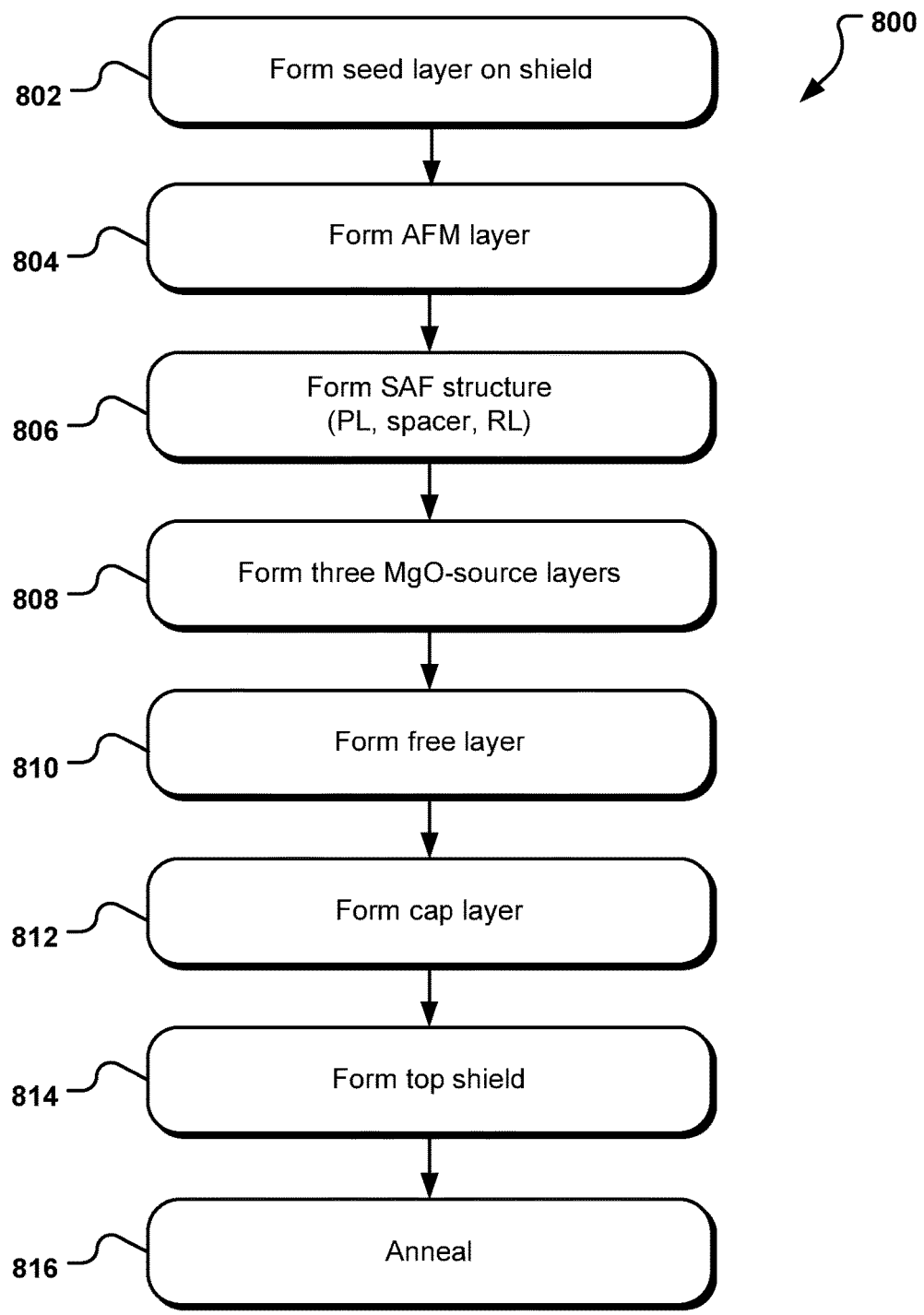
FIG. 8 is a step-wise flow diagram of an example method of forming a TMR sensor.

FIG. 8 provides an exemplary method 800 for forming a TMR sensor. In operation 802, a seed layer is formed on a bottom shield. In operation 804, an antiferromagnetic (AFM) layer is provided on the seed layer. In operation 806, a SAF structure (which includes a pinned layer (PL), a spacer layer (e.g., Ru layer), and a reference layer (RL)) is provided on the AFM layer. In operation 808, three MgO-source layers are provided on the reference layer of the SAF structures; the three Mg—O source layers may be formed, for example, by any of method 400 of FIG. 4, method 500 of FIG. 5, method 600 of FIG. 6, or method 700 of FIG. 7. In operation 810, a free layer is formed on the MgO-source layers. In operation 812, a cap layer is provided on the free layer. In operation 814, a top shield is formed on the cap layer. In operation 816, the entire stack of layers, which includes the MgO-source layers, is annealed to form the TMR sensor with MgO barrier layer.

Figure 9:
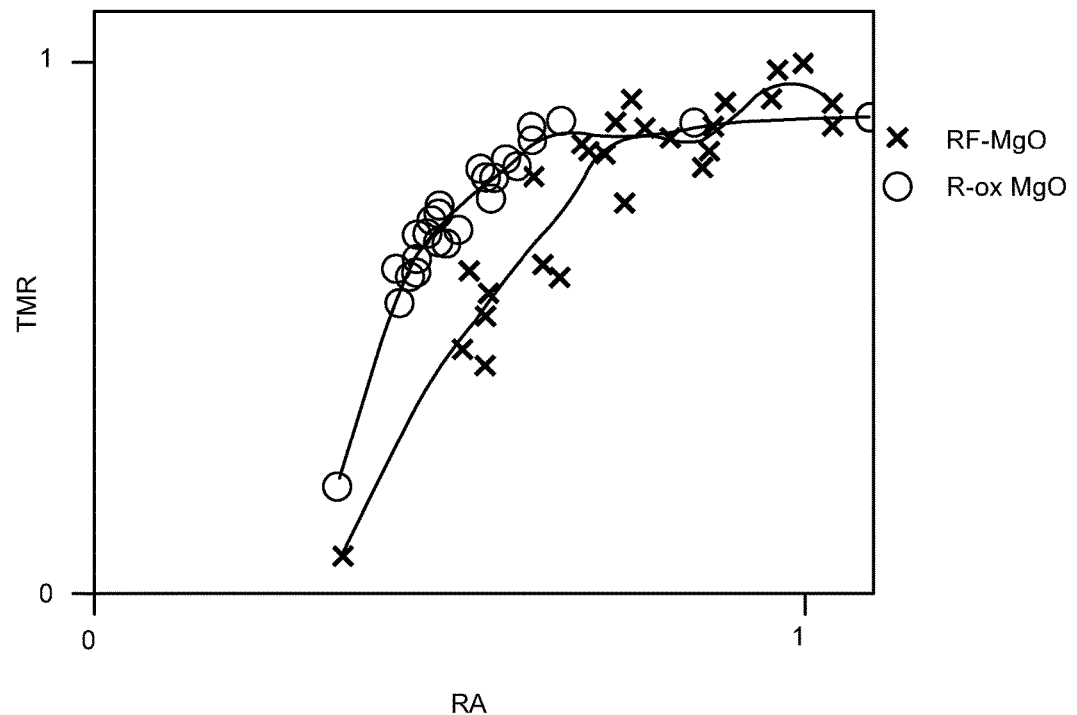
FIG. 9 is a graphical illustration of TMR as a function of RA for a TMR sensor.

FIG. 9 shows a graph of normalized TMR as a function of normalized RA, for both a TMR sensor having an MgO barrier layer formed with a reactive oxidation MgO process (R-ox MgO) and a TMR sensor having an MgO barrier formed by conventional RF-MgO process. The R-ox MgO process demonstrates higher TMR than RF-MgO process.

Figure 10:
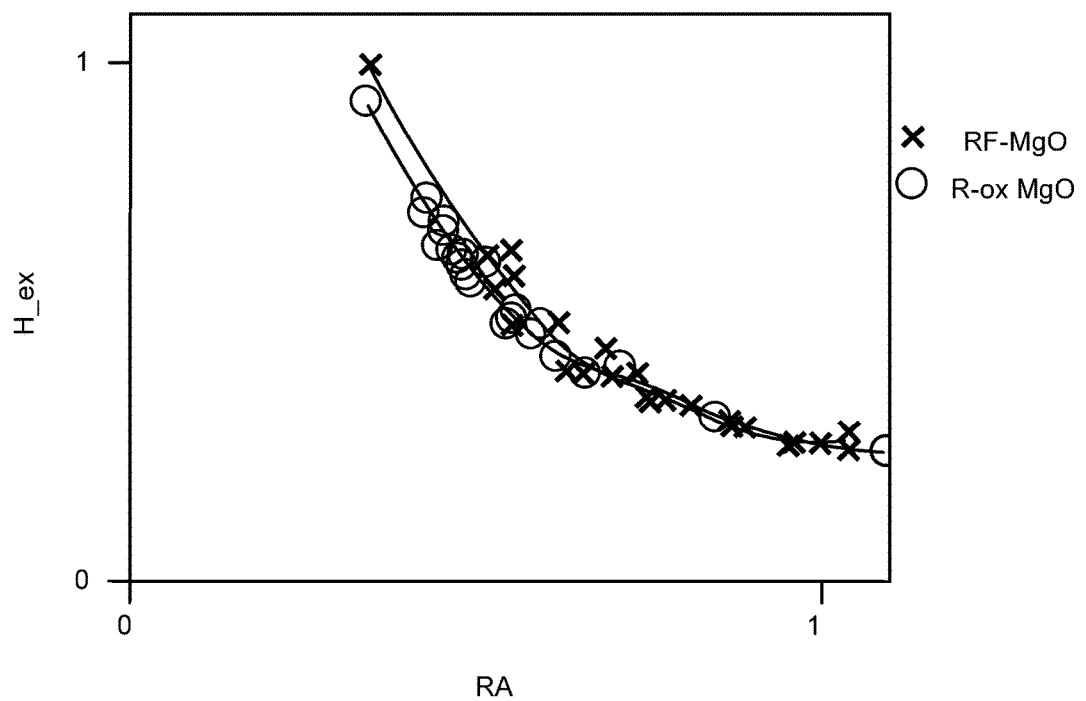
FIG. 10 is a graphical illustration of free layer exchange coupling (H_ex) as a function of RA for a TMR sensor.

FIG. 10 shows a graph of normalized free layer exchange coupling (H_ex) as a function of normalized RA, for both a TMR sensor having an MgO barrier layer formed with a reactive oxidation MgO process (R-ox MgO) and a TMR sensor having an MgO barrier layer formed by conventional RF-MgO process. From the graph, it is seen that the R-ox MgO can reduce the free layer exchange coupling field (H_ex).

Both FIG. 9 and FIG. 10 show that the quality of the MgO barrier layer is improved by using an R-ox MgO process. The MgO barrier layer resulting from the R-ox MgO process is more uniform, smooth, and has less pin-holes than an MgO barrier layer formed by an RF-MgO process. Additionally, with an MgO barrier layer formed by a R-ox MgO process, the resulting TMR sensor has higher TMR and lower H_ex than a TMR sensor having an MgO barrier layer formed by an RF-MgO process.

Thus, various features of an MgO barrier layer formed by a reactive oxidation (R-ox) MgO deposition process have been described. The above specification provides a complete description of the structure and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about." Accordingly, unless indicated to the contrary, any numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Spatially related terms, including but not limited to, "bottom," "lower", "top", "upper", "beneath", "below", "above", "on top", "on," etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A method of making an MgO barrier layer for a TMR sensor, the method comprising:
    depositing a first Mg layer from an Mg target to form an as-deposited first MgO-source layer;
    depositing a second MgO-source layer on the as-deposited first MgO-source layer using a reactive oxide deposition process in the presence of oxygen from an Mg target to form an as-deposited second MgO-source layer;
    depositing a third MgO-source layer on the as-deposited second MgO-source layer from an Mg target to form an as-deposited third MgO-source layer; and
    annealing the as-deposited first MgO-source layer, the as-deposited second MgO-source layer, and the as-deposited third MgO-source layer to form an MgO barrier layer.

2. The method of claim 1, wherein the step of depositing the second MgO-source layer is with $O_2$.

3. The method of claim 1, wherein the step of depositing the second MgO-source layer is with $O^{-2}$ ions.

4. The method of claim 1, wherein the step of depositing the third MgO-source layer comprises depositing a third Mg layer.

5. The method of claim 1, wherein the step of depositing the second MgO-source layer comprises depositing an Mg layer in the presence of oxygen.

6. The method of claim 5, wherein the step of depositing the second MgO-source layer further comprises utilizing a sputtering gas being selected from Ar, Kr, Xe, He, and Ne.

7. The method of claim 1, wherein one or more of the first MgO-source layer, the second MgO-source layer, and the third MgO-source layer has a thickness of 0.1-20 Angstroms.

8. The method of claim 7, wherein the first MgO-source layer, the second MgO-source layer, and the third MgO-source layer have different thicknesses.

9. The method of claim 7, wherein the first MgO-source layer, the second MgO-source layer, and the third MgO-source layer have the same thickness.

10. The method of claim 7, wherein each of the first MgO-source layer, the second MgO-source layer, and the third MgO-source layer has a different thickness.

11. The method of claim 1, wherein depositing the first Mg layer is by DC-sputter deposition.

12. The method of claim 4, wherein depositing the third Mg layer is by DC-sputter deposition.

13. A method of making an MgO barrier layer for a TMR sensor, the method comprising:
    depositing a first Mg layer from an Mg target to form an as-deposited first Mg layer;
    depositing a second MgO-source layer on the as-deposited first Mg layer using a reactive oxide deposition process in the presence of oxygen from an Mg target to form an as-deposited second MgO-source layer;
    depositing a third Mg layer on the as-deposited second MgO-source layer from an Mg target to form an as-deposited third Mg layer; and
    annealing the as-deposited first Mg layer, the as-deposited second MgO-source layer, and the as-deposited third Mg layer to form an MgO barrier layer.

14. The method of claim 13, wherein depositing the first Mg layer is by DC-sputter deposition.

15. The method of claim 13, wherein depositing the third Mg layer is by DC-sputter deposition.

16. The method of claim 13, wherein depositing the second MgO-source layer is with $O_2$.

17. The method of claim 13, wherein depositing the second MgO-source layer is with $O^{-2}$ ions.

* * * * *